United States Patent [19]

Wagner

[11] 4,275,453
[45] Jun. 23, 1981

[54] SMOOTHING FILTER FOR DIGITAL TO ANALOG CONVERSION

[75] Inventor: Charles A. Wagner, North Edwards, Calif.

[73] Assignee: The United States of America as represented by the Administrator of the National Aeronautics and Space Administration, Washington, D.C.

[21] Appl. No.: 115,536

[22] Filed: Jan. 25, 1980

[51] Int. Cl.³ .................... H03H 11/12; H04B 15/00
[52] U.S. Cl. .................................. 364/825; 330/109; 330/290; 330/294; 330/306; 328/167
[58] Field of Search ............... 364/825, 811; 328/165, 328/167; 330/85, 107, 109, 290, 294, 302, 303, 306, 310

[56] References Cited

U.S. PATENT DOCUMENTS

| | | | |
|---|---|---|---|
| 3,696,252 | 10/1972 | Chapman | 328/167 X |
| 3,789,313 | 1/1974 | Sanderson | 330/107 |
| 3,835,399 | 9/1974 | Holmes | 328/167 |
| 3,967,102 | 6/1976 | McCown | 328/167 X |
| 3,999,137 | 12/1976 | Fucito | 328/167 |
| 4,032,857 | 6/1977 | Lum | 328/167 X |
| 4,158,818 | 6/1979 | Lerner | 328/167 |
| 4,163,948 | 8/1979 | Rieger et al. | 328/167 |
| 4,189,681 | 2/1980 | Lawson et al. | 330/294 X |

OTHER PUBLICATIONS

Melsheimer: If You Need Active Filters, Electronic Design, Apr. 12, 1967, pp. 78–82.
Tow: A Step By Step Active Filter Design, IEEE Spectrum, Dec. 1969, pp. 64–68.
Bainter: Active Filter Has Stable Notch and Response Can Be Regulated, Electronics, Oct. 2, 1975, pp. 115–117.
Sonderstrand et al: A Simple Filter Design Procedure, Int. Journal of Electronics, vol. 46, No. 1, 1979, pp. 19–32.

Primary Examiner—Felix D. Gruber
Attorney, Agent, or Firm—Monte F. Mott; John R. Manning; Paul F. McCaul

[57] ABSTRACT

An electronic filter comprised of three active filter sections (A, B, C) is provided to smooth the stepped signal from a digital-to-analog converter. The first section has a noninverting low-pass filter transfer function, and the second has an inverting transfer function designed to pass a narrow frequency band centered at the step frequency of the stepped output signal with sharp cutoff on either side of that narrow band. The third section adds the noninverted output of the first section to the inverted output of the second section. This third section has a lead-lag transfer function designed to reduce the phase angle between the signal at its output terminal and the stepped signal at the input of the first section.

9 Claims, 2 Drawing Figures

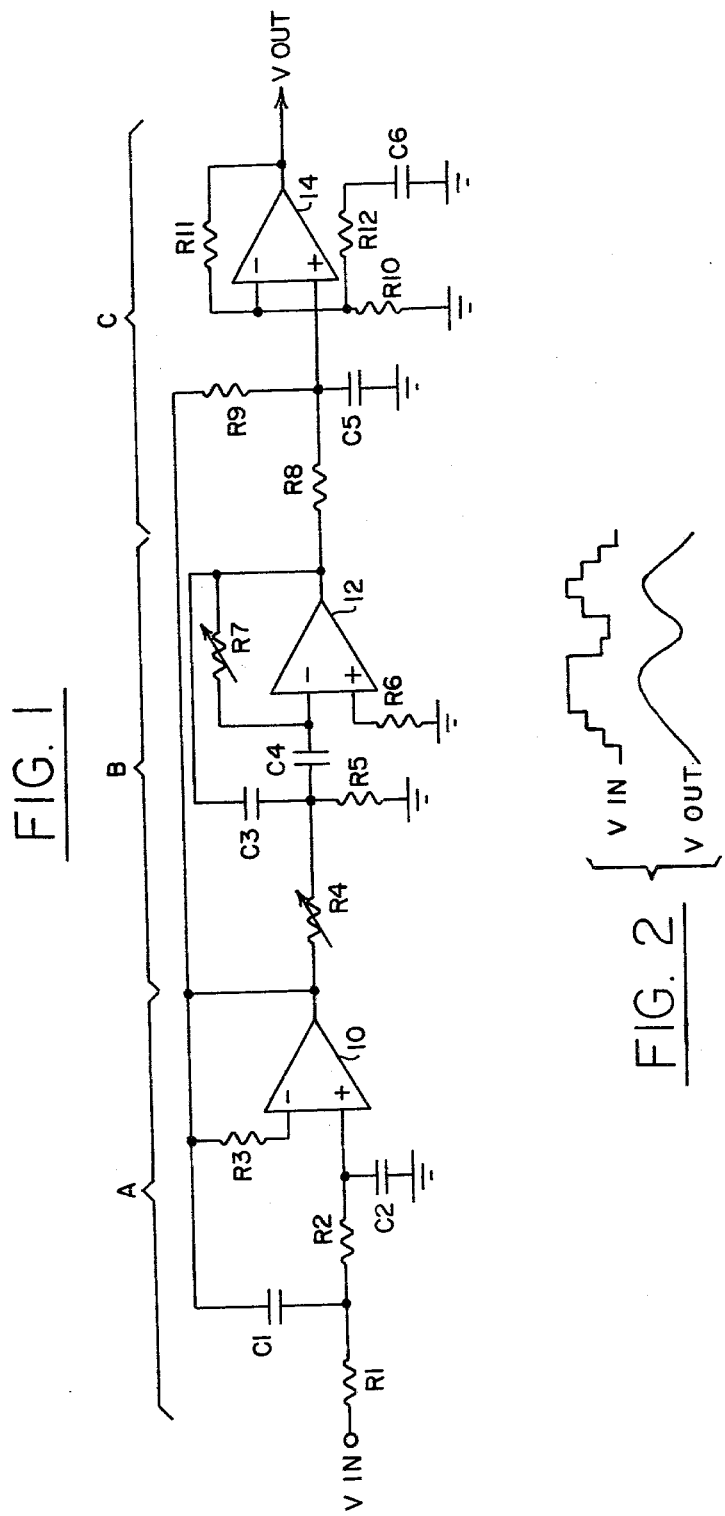

SMOOTHING FILTER FOR DIGITAL TO ANALOG CONVERSION

ORIGIN OF THE INVENTION

The invention described herein was made by an employee of the U.S. Government and may be manufactured and used by and for the Government for Government purposes without the payment of any royalties thereon or therefor.

BACKGROUND OF THE INVENTION

This invention relates to an electronic analog filter for smoothing the stepped output from a digital-to-analog converter.

In many applications having a sampled data signal processed in digital form, it is necessary to convert the digital signal to analog form. Typically, this is when a digital computer is required to produce an analog output. There are numerous potential applications in industrial process control systems, aerospace control systems, automotive control systems, and the like.

The computer, or other type of digital processing system, produces an output which is a continuous series of values in binary form as though each value were a sample of a continuous function, where the samples are taken at equally spaced intervals called the frame time, or clock period where the clock rate is established by the computer. The output is held constant at each value for one frame time (clock period), after which it rapidly switches to the next value. Each value is converted from digital to analog form virtually instantaneously, so the analog output is a stepped waveform.

A stepped waveform output of this kind is unacceptable for many applications. One method of remedying this situation is to increase the sample clock rate, i.e., decrease the frame time for each value, but this method is usually not available since it decreases the time available for computing the value. Only a very high speed computer with few computation steps per value can use this method. The more usual method involves the use of an effective analog filter, thereby increasing the amount of computation that can be used to compute each value in one frame time.

For a smooth filtering operation, a band-pass RLC filter would be required having a high Q factor, which is a figure of merit that measures the relationship between the energy stored by the inductance, L, and the capacitance, C, and the rate of dissipation of energy. In its simplest form, an RLC filter is comprised of a resistor in series with an LC tank circuit. Its Q factor is given by the ratio of its reactance in the tank circuit to its effective series resistance at a given frequency. Since the frequency of the signal being smoothed is a function of the digital values, and may vary from virtually zero (for a steady state digital output) to some upper limit, which is a function of the dynamic response of the load receiving the digital-to-analog converted signal being smoothed, the bandwidth of the filter is apt to be quite large.

To facilitate design of a band-pass filter, it has been the practice to use operational amplifiers coupled to simulate inductance as disclosed in U.S. Pat. No. 3,835,399. This permits the design of a stable tunable band-pass filter capable of operation over a wide range of band widths and center frequencies. Such an active filter would help meet the high Q requirements of a low-pass filter. But such an active filter is not itself adequate for the task at hand due to the presence of the sample frequency and the attendant phase angle of the filter over a certain range of frequencies.

OBJECTS AND SUMMARY OF THE INVENTION

An object of this invention is to provide an active low-pass filter for use with a sampled signal converted to an analog signal and which eliminates the effects of sampling frequencies.

Still another object is to provide a filter for a sampled signal converted to analog with a reduced phase angle between the input and the output over a predetermined range of frequencies.

These and other objects of the invention are achieved by three active filter sections, a first (noninverting) section having a transfer function of a second order low-pass filter, a second (inverting) section having a transfer function of a narrow band-pass filter set at the sample frequency, and a third active (noninverting) section having a transfer function of a lead-lag filter connected to add the output of the first (noninverting) section and the output of the second (inverting) section and operate on the sum to reduce the phase angle between the input to the first section and the output of the third section over a predetermined range of frequencies. Summing an inverted narrow band-pass filter output with a noninverted signal produces a notch filter. The combination thus smooths the sampled signal using a low-pass filter with components of the sampling frequency effectively notch filtered with virtually no phase angle between the input and output over a predetermined range of frequencies for the analog signal.

The novel features that are considered characteristic of this invention are set forth with particularity in the appended claims. The invention will best be understood from the following description when read in connection with the accompanying drawings.

BRIEF DESCRIPTION OF THE DRAWINGS

FIG. 1 is a schematic diagram of an electronic analog filter for smoothing a stepped output from a digital-to-analog converter.

FIG. 2 illustrates the input and output voltages of the filter of FIG. 1.

DESCRIPTION OF PREFERRED EMBODIMENTS

Referring now to FIG. 1, a filter for smoothing the stepped output from a digital-to-analog converter driven by a digital computer is comprised of three sections, a low-pass filter section A, a narrow band-pass filter section B, and a lead-lag filter C. The stepped waveform produced by a digital-to-analog converter and applied to the circuit input, V IN, is shown in FIG. 2. Each step occurs at equally spaced intervals called the frame time established by clock pulses from the digital computer. The voltage is held constant during each frame time, after which it rapidly switches to the next interval level. An analog signal of this form is unacceptable for many applications. To make the signal acceptable, the filter circuit of FIG. 1 transforms the analog signal, V IN, to an output signal, V OUT, of the form shown in FIG. 2 with virtually no phase shift between the stepped waveform input signal and the smoothed signal, and virtually no effect from the sample frequency, i.e., the frequency at which new digital values are converted to voltage levels.

The low-pass filter section A is an active filter utilizing an operational amplifier 10 coupled to the input signal, V IN, by resistors R1 and R2. A resistor R3 connected between the amplifier output and the inverting (−) input terminal of the amplifier provides stabilizing negative feedback. The high Q, low-pass filtering action is provided by a capacitor C1 connected between the amplifier output and a junction between the resistors R1 and R2, and a capacitor between the noninverting (+) input of the amplifier and circuit ground. This active filter section has a transfer function, $F_1$, given by the following expression:

$$F_1 = \frac{1}{1 + 2Z_1 T_1 S + T_1^2 S^2}$$

where S is the complex Laplace operator, $$T_1 = \sqrt{R1\,R2\,C1\,C2}$$
$$Z_1 = \frac{R1 + R2}{2\sqrt{R1\,R2\,(C1/C2)}}$$

Note that the negative feedback resistor R3 is not a factor in this transfer function. Only the resistors R1 and R2 and the capacitors C1 and C2 are factors. Note also that the gain of the operational amplifier is not a factor. However, amplifier bias current may dictate the additional constraint of R3=R1+R2.

Generally the transfer function of the first section A is a low-pass filter. By itself it could not be used as a smoothing filter because of the sampling frequency present in the stepped waveform and the phase shift that would occur between the input and the output. To eliminate the sampling frequency, the sum of the output of the second section B and the output of the first section A is provided with a transfer function, $F_2$, given by the expression:

$$F_2 = \frac{1 + T_2^2 S^2}{1 + 2Z_2 T_2 S + T_2^2 S^2}$$

where:

$$T_2 = \sqrt{\frac{R4\,R5\,R7}{R4 + R5} C3\,C4}$$
$$Z_2 = \frac{C3 + C4}{\sqrt[2]{\frac{R4 + R5}{R4\,R5} R7\,C3\,C4}}$$

The resistors R4 through R7, and the capacitors C3 and C4 are connected to an operational amplifier 12 as shown in FIG. 1. Resistor R4 couples the output of the first section to a junction between capacitor C3 and resistor R5. That junction is connected to the inverting (−) input terminal of the amplifier 12 by the capacitor C4. Resistor R6 connects the noninverting (+) input terminal of the amplifier 12 to circuit ground, and resistor R7 provides stabilizing negative feedback between the output and the inverting input of the amplifier 12. Note that resistor R6 is not a factor in this transfer function, nor is the gain of the amplifier, but an additional constraint is R7/R4=1+C3/C4. This constraint makes the gain of the narrow band-pass amplifier 12 exactly unity at the resonant frequency. When the output of amplifier 12 is added to its input, the result is a notch filter with zero gain at the notch frequency.

The frequency at which the second section 2 must be accurately tuned to pass is aligned with the computer frame time $T_f$, using the relationship:

$$T_2 = (T_f/2\pi)$$

To facilitate making this critical adjustment while simultaneously meeting the above notch constraint, both the coupling resistor R4 and the feedback resistor R7 are preferably made adjustable, as shown, to permit accurate adjustment.

A notch filtered signal of the input, V IN, is synthesized by subtracting the output of the second section from the output of the first section. Since the second section is inverting, while the first is not, this is accomplished by adding the outputs of the first and second sections through equal resistors R8 and R9 connected to the noninverting input of an operational amplifier 14 in the third section. A capacitor C5 connects the junction of the two resistors to circuit ground. The output, V OUT, of the amplifier 14 is connected to its inverting (−) input by a feedback resistor R11. The inverting input is also connected to circuit ground by a resistor R12 and capacitor C6 in series, and by a resistor R10 in parallel with the series circuit of resistor R12 and capacitor C6. The transfer function $F_3$, of the third section is given by the following expression:

$$F_3 = \frac{G(1 + T_3 S)}{(1 + T_4 S)(1 + T_5 S)} \text{ where } G = \frac{R8}{R8 + R9} \cdot \frac{R10 + R11}{R10}$$

Note that R8=R9 to satisfy the notch filter requirement. Thus the expressions for G and $T_3$ become:

$$G = \frac{1 + \frac{R11}{R10}}{2}$$
$$T_5 = \frac{R8\,C5}{2}$$
$$T_3 = \left(R12 + \frac{R10\,R11}{R10 + R11}\right) C6$$
$$T_4 = R12\,C6$$

All components of the three sections except R8, R9, R10 and R11 can have tolerances as large as 5%. The tolerances of these four resistors are dictated by the requirement for overall gain accuracy. Precision capacitors are not required, provided R4 and R7 are adjustable. Alternatively, to avoid the need for adjustments, R4, R5, R7, C3 and C4 can be precision components with tolerances of 1% or better. As stated above, these constraints are:

$$\frac{R7}{R4} = 1 + \frac{C3}{C4}$$
$$R8 = R9$$

Amplifier bias current in the three sections may dictate additional constraints, as follows:

$$R3 = R1 + R2$$
$$R6 = R7$$
$$\frac{R8\,R9}{R8 + R9} = \frac{R10\,R11}{R10 + R11}$$

Most of the filter constraints are not critical, and can be allowed to vary up to 10%. The recommended values of the noncritical constraints are:

$Z_1 = 0.25$
$Z_2 = 0.25$
$T_1 = T_f/3$
$T_3 = 0.67 T_f$
$T_4 = 0.27 T_f$
$T_5 = 0.09 T_f$ where $T_f$ is the frame time (sample period). The critical constraint is that the notch frequency of the second section must be accurately aligned with the frame time, $T_f$, using the relationship $T_2 = T_f/2$.

The total transfer function of the filter circuit is given by the expression.

$$(V\ OUT/V\ IN) = F_1 F_2 F_3$$

Where $F_1$, $F_2$ and $F_3$ are the transfer functions of the first, second and third sections as set forth above. Since the notch portion, $F_2$, is critical, it is recommended that both resistor R4 and resistor R7 be made adjustable to permit accurate adjustment of the relationships:

$T_2 = T_f/2\pi$
$(R7/R4) = 1 + (C3/C4)$

The notch portion is then easily adjusted by injecting only a sinusoidal input at the desired frame rate, and adjusting the trim resistors R4 and R7 for zero output.

An exemplary circuit has been successfully used with the following particulars:

$T_f = 18.75$ ms
R1 = 51 K
R2 = 16 K
R3 = 68 K
R4 = Variable, 39 K to 89 K (Nominal value 56.75 K)
R5 = 9.1 K
R6 = 130 K
R7 = Variable, 75 K to 175 K (Nominal value 113.5 K)
R8 = R9 = R10 = R11 = 150 K
R12 = 51 K
C1 = 1 uf
C2 = 0.047 uf
C3 = C4 = C6 = 0.1 uf
C5 = 0.022 uf In operation, the first section of the filter functions as a noninverting active low-pass filter, the second section functions as an inverting narrow band-pass filter amplifier tuned to the frame time of the stepped analog input signal, V IN, and the third term functions as a summing amplifier to add the output of the low-pass filter section and the narrow band-pass filter section, thereby to subtract out of the low-pass filtered signal the sampling frequency, $1/T_f$. The third term also functions as lead-lag filter designed to reduce the phase angle between the input, V IN, and the output, V OUT, over a predetermined range of frequencies.

This noninverting filter has several desirable features. It is easily implemented using only three operational amplifiers, which can be ¾ of a quad operational amplifier package. Nearly all the components can have tolerances as large as 5%, except for the four resistors R8 through R11. Precision capacitors are not required. Calibration is easily done by simply injecting a sinusoidal input at the desired frame rate and adjusting the trim resistors R4 and R7 for zero output, as noted above.

According to sampled data theory, sampled signals contain no information at frequencies above the Nyquist frequency, which is half the frame rate. No real filter can correctly reproduce the original signal at all frequencies up to the Nyquist frequency, but this filter can reproduce the original signal with an amplitude error of +1 dB and 20%, and +3 dB at 40% of the Nyquist frequency. Phase shift up to the 40% point is negligible.

Although particular embodiments of the invention have been described and illustrated herein, it is recognized that modifications and variations may readily occur to those skilled in the art. Consequently, it is intended that the claims be interpreted to cover such modifications and equivalents.

What is claimed is:

1. An electronic filter for smoothing the stepped signal from a digital-to-analog converter comprising three active filter sections, each having an input terminal and an output terminal, and said third section having two input terminals for receiving the signals at output terminals of said first and second sections, said first section having a noninverting low-pass filter transfer function, said second section having its input terminal connected to the output terminal of said first section, said second section having an inverting transfer function designed to pass a narrow frequency band centered at the step frequency of said stepped output signal with sharp cutoff on either side of said band, and said third section having one input terminal connected to the output terminal of said second section and one input terminal connected to the output terminal of said first section for summing the signals at output terminals of said first and second sections, said third section having a noninverting lead-lag transfer function designed to reduce the phase angle between the signal at its output terminal and the stepped signal at the input of said first section.

2. An electronic filter for smoothing the stepped signal out of a digital-to-analog converter as defined in claim 1 having a transfer function given by the following expression $$(V\ OUT/V\ IN) = F_1 F_2 F_3$$

where $F_1$ is the transfer function of the first section, $F_2$ is the transfer function of the second section given by the expression $$F_2 = \frac{1 + T_2^2 S^2}{1 + 2Z_2 T_2 S + T_2^2 S^2}$$

where S is the complex Laplace operator, and $F_3$ is the transfer function of the third section.

3. An electronic filter as defined in claim 2 wherein the transfer function, $F_3$, of the third section is given by the expression $$F_3 = \frac{G(1 + T_3 S)}{(1 + T_4 S)(1 + T_5 S)}$$

4. An electronic filter as defined in claim 3 wherein said transfer function, $F_1$, of said first section is given by the expression $$F_1 = \frac{1}{1 + 2Z_1 T_1 S + T_1^2 S^2}$$

5. An electronic filter as defined in claim 4 wherein said transfer function, $F_1$, of said first section is implemented by a circuit comprised of a first operational amplifier having an inverting and noninverting input, first and second resistors, R1 and R2, connected in series to couple the stepped signal from the digital-to-analog converter to the noninverting terminal of said operational amplifier, a feedback capacitor, C1, coupling the output of said amplifier to a junction between said first and second resistors, a second capacitor connected between said noninverting input and circuit ground, and a third resistor coupling the output of said amplifier to the inverting input terminal thereof, and where the constants in the transfer function $F_1$ are related to the circuit components by the following expressions $$T_1 = \sqrt{R1\,R2\,C1\,C2}$$
$$Z_1 = \frac{R1 + R2}{2\sqrt{R1\,R2\,(C1/C2)}}$$

6. An electronic filter as defined in claim 5 wherein the resistance of said third resistor is equal to the sum of the resistances of said resistors R1 and R2.

7. An electronic filter as defined in claim 5 wherein said transfer function, $F_2$, of said second section is implemented by a circuit comprised of a second operational amplifier having an inverting input terminal and a noninverting input terminal, a fourth resistor, R4, and a fifth resistor, R5, connected in series between the output terminal of said first operational amplifier and circuit ground, a third capacitor, C3, coupling the output terminal of said second operational amplifier to the junction between said fourth and fifth resistors, a fourth capacitor, C4 coupling the junction between said fourth and fifth resistors and said third capacitor to the inverting input terminal of said operational amplifier, a sixth resistor, R6, connected between the noninverting input terminal of said operational amplifier and circuit ground, and a seventh resistor, R7, connecting the output of said second operational amplifier to the inverting input terminal thereof, and wherein the constants in the transfer function $F_2$ are related to the circuit components by the following expressions $$T_2 = \sqrt{\frac{R4\,R5\,R7}{R4 + R5}\,C3\,C4}$$
$$Z_2 = \frac{C3 + C4}{2\sqrt{\frac{R4 + R5}{R4\,R5}\,R7\,C3\,C4}}$$

and $R7/R4 = 1 + C3/C4$.

8. An electronic filter as defined in claim 7 wherein the resistance of said sixth resistor, R6, is equal to the resistance of said seventh resistor, R7.

9. An electronic filter as defined in claim 8 wherein said transfer function, $F_3$, of said third section is implemented by a circuit comprised of a third operational amplifier having a noninverting input terminal and an inverting terminal, eighth and ninth resistors, R8 and R9, coupling said noninverting input terminal of said third operational amplifier to the respective output terminals of said second and first operational amplifiers, a fifth capacitor, C5, connecting the noninverting input terminal of said third operational amplifier to circuit ground, a sixth capacitor, C6, and a twelfth resistor, R12, connected in series between the inverting input terminal of said third operational amplifier and circuit ground, an eleventh resistor, R11, connecting the output terminal of said third operational amplifier to the inverting input terminal thereof, and a tenth resistor, R10, connected between the inverting input terminal of said third operational amplifier and circuit ground, and wherein the constants in the transfer function $F_3$ are related to the circuit components by the following expressions $$T_5 = \frac{R8\,C5}{2},$$
$$T_3 = R12 + \frac{R10\,R11}{R10 + R11}\,C6,$$
$$T_4 = R12\,C6,$$
$$G = \frac{1 + \frac{R11}{R10}}{2},$$

and further wherein the following constraints on circuit components are observed $$\frac{R7}{R4} = 1 + \frac{C3}{C4}$$
$$R8 = R9$$

* * * * *